(12) United States Patent
Yamartino

(10) Patent No.: US 8,676,367 B2
(45) Date of Patent: Mar. 18, 2014

(54) LOT PROCESS ORDER MODIFICATION TO IMPROVE DETECTION OF MANUFACTURING EFFECTS

(75) Inventor: John M. Yamartino, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 12/914,223

(22) Filed: Oct. 28, 2010

(65) Prior Publication Data

US 2012/0109351 A1    May 3, 2012

(51) Int. Cl.
*G06F 19/00* (2011.01)
*B24B 49/00* (2012.01)

(52) U.S. Cl.
USPC .............................................. 700/101; 451/1

(58) Field of Classification Search
USPC ........... 700/99, 100, 101, 102, 103, 104, 108, 700/109
See application file for complete search history.

(56) References Cited

U.S. PATENT DOCUMENTS

| | | | |
|---|---|---|---|
| 5,930,138 A | 7/1999 | Lin et al. | |
| 6,599,763 B1 | 7/2003 | Reyes et al. | |
| 6,684,125 B2 | 1/2004 | Kahn et al. | |
| 6,701,204 B1 | 3/2004 | Nicholson | |
| 6,711,450 B1 | 3/2004 | Conboy et al. | |
| 6,947,804 B1 | 9/2005 | Pak et al. | |
| 7,085,612 B2 | 8/2006 | Liu et al. | |
| 7,668,615 B2 * | 2/2010 | Goff et al. | 700/101 |
| 8,229,587 B2 * | 7/2012 | Shieh et al. | 700/112 |
| 2004/0039469 A1 * | 2/2004 | Lin | 700/100 |
| 2004/0111180 A1 * | 6/2004 | Kahn et al. | 700/218 |
| 2008/0103618 A1 | 5/2008 | Stirton et al. | |
| 2009/0110519 A1 * | 4/2009 | Park et al. | 414/222.01 |
| 2009/0149979 A1 * | 6/2009 | McGahay | 700/101 |
| 2009/0287338 A1 * | 11/2009 | Paradis | 700/110 |
| 2009/0299510 A1 * | 12/2009 | Burda et al. | 700/101 |
| 2010/0318209 A1 * | 12/2010 | Goss et al. | 700/100 |

OTHER PUBLICATIONS

Y. Lu; Scheduling of Wafer Test Processes in Semiconductor Manufacturing; Thesis—Virginia Polytechnic Institue and State University; Oct. 2001; pp. 1-173.

Microscopic Manufacturing at Motorola, [online]; [retrieved on Aug. 12, 2010]; retrieved from the Internet http://www.autofieldguide.com/articles/060204.html.

\* cited by examiner

*Primary Examiner* — Kavita Padmanabhan
*Assistant Examiner* — Darrin Dunn
(74) *Attorney, Agent, or Firm* — Cantor Colburn LLP; Ian MacKinnon

(57) ABSTRACT

A system for lot based, multi-step wafer manufacturing processes is provided and includes a transfer apparatus, disposed among tools for performing respective process steps on each wafer of each lot of wafers transferred thereto, the transfer apparatus being configured to transfer each lot from a current tool to a next tool in accordance with a process step sequence, a dispatcher operably coupled to the transfer apparatus to modify the lot order in response to a modification condition detection, a measurement unit configured to receive each wafer of each fully processed lot and to collect measurements therefrom and a processor disposed in signal communication with the dispatcher and the measurement unit to analyze the measurements relative to the lot order for evidence that a process step of a corresponding tool is responsible for performance effects.

15 Claims, 4 Drawing Sheets

LOT PROCESS ORDER MODIFICATION TO IMPROVE DETECTION OF MANUFACTURING EFFECTS

BACKGROUND

Aspects of the present invention are directed to lot process order modification to improve detection of manufacturing effects.

The manufacture of most products, such as wafers containing semiconductor devices, requires a number of discrete processing steps to create the product. For wafers, a number of discrete steps are needed to produce a packaged semiconductor circuit device from raw semiconductor material. The starting substrate is usually a slice of single crystal silicon referred to as a wafer. Circuits of a particular type are fabricated together in batches of wafers called "lots" or "runs". The fabrication process creates regular arrays of a circuit on the wafers of a lot. During processing, the individual wafers in a lot may go through individual processing steps one at a time or as a batch. There may be hundreds or thousand of these processing steps before completion. At the completion of wafer processing, the wafers are tested to determine circuit functionality. Later, the wafers are sliced, the functioning products are packaged and further testing occurs.

In such lot based, multi-step processing, an effect from a single process step (PDID) in the route may degrade the processing performance with a distinct temporal signature. For example, the performance may shift from one performance level to another due to a piece of equipment malfunctioning. If the lot sequence is unchanged throughout the route, however, a graphical analysis of the time series of the performance vs. the lot sequence at each process step will look identical. This will make it impossible to use charts or time series analysis to distinguish between all the possible process steps as possible sources of the temporal signature.

The extent to which the lot sequence is not identical at each process step provides sensitivity to a time series analysis of the performance vs. lot sequence data on a process step basis. Currently, in many lot based, multi-step processes, lot order changes do occur as a result of lot priorities, holds, tools faults and/or other similar issues. However, the effects of these lot order changes are relatively minor and cannot be used to significantly alter the appearance of the graphical analysis of the time series of the performance vs. the lot sequence.

SUMMARY

In accordance with an aspect of the invention, a system for lot based, multi-step wafer manufacturing processes is provided and includes a transfer apparatus, disposed among tools for performing respective process steps on each wafer of each lot of wafers transferred thereto, the transfer apparatus being configured to transfer each lot from a current tool to a next tool in accordance with a process step sequence, a dispatcher operably coupled to the transfer apparatus to modify the lot order in response to a modification condition detection, a measurement unit configured to receive each wafer of each fully processed lot and to collect measurements therefrom and a processor disposed in signal communication with the dispatcher and the measurement unit to analyze the measurements relative to the lot order for evidence that a process step of a corresponding tool is responsible for performance effects.

In accordance with an aspect of the invention, a system for lot based, multi-step wafer manufacturing processes is provided and includes a transfer apparatus, disposed among tools for performing respective process steps on each wafer of each lot of wafers transferred thereto, the transfer apparatus being configured to transfer each lot from a current tool to a next tool in accordance with a process step sequence, a dispatcher operably coupled to the transfer apparatus to modify the lot order in response to a lot order constraint and to modify the lot order in response to a modification condition detection, a measurement unit configured to receive each wafer of each fully processed lot and to collect measurements therefrom and a processor disposed in signal communication with the dispatcher and the measurement unit to analyze the measurements relative to the lot order for evidence that a process step of a corresponding tool is responsible for performance effects.

In accordance with an aspect of the invention, a method of operating a system for lot based, multi-step wafer manufacturing processes is provided and includes at selected process steps and for available lots, determining a modified lot order that is different from a lot order in a prior process step, processing the lots according to the modified lot order, collecting measurements from wafers within the lots that have been fully processed and analyzing the measurements relative to lot order sequence data for evidence that a process step is responsible for performance effects.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

Figure 1:
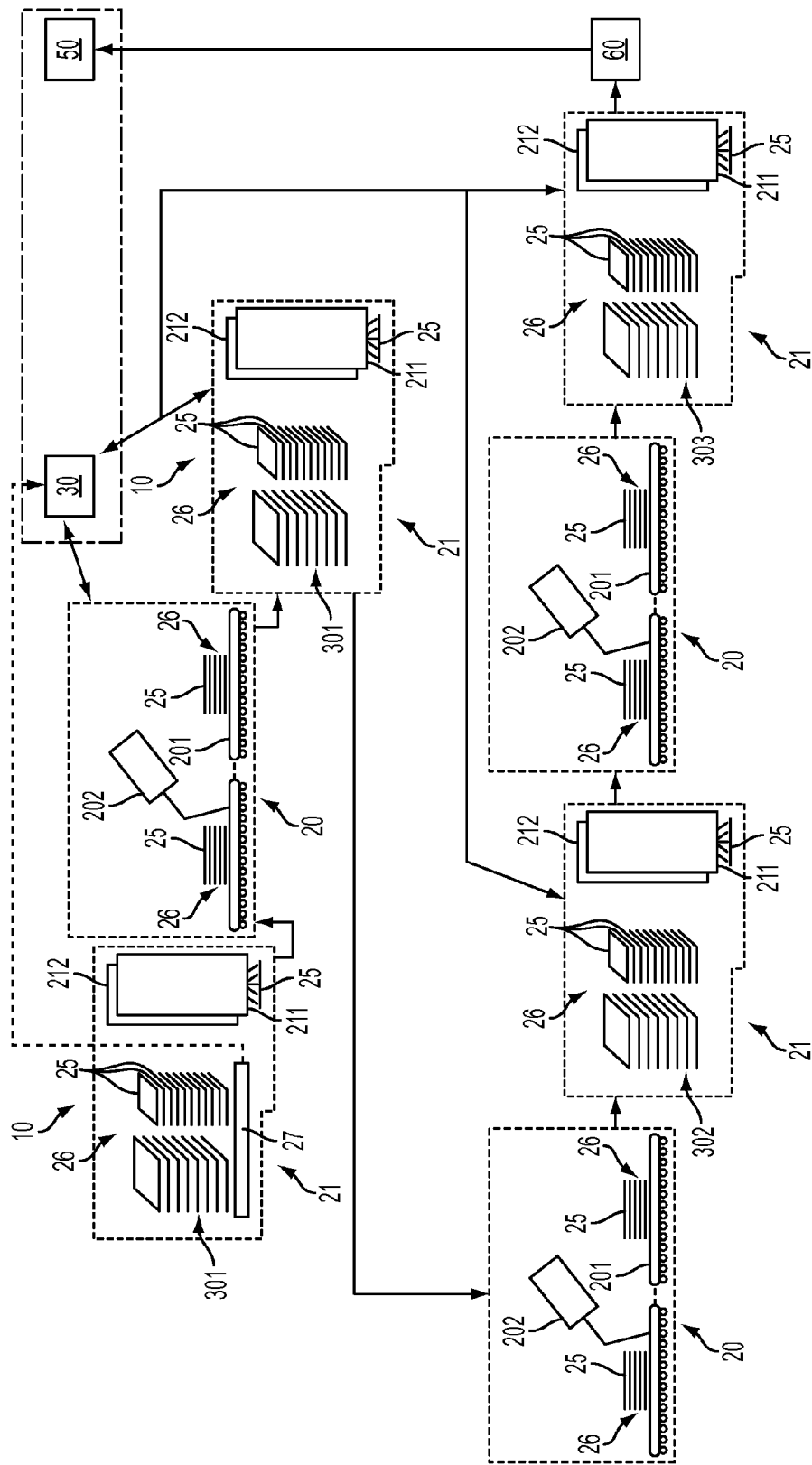
FIG. 1 is a schematic illustration of a lot based multi-step wafer manufacturing process.
Figure 3:
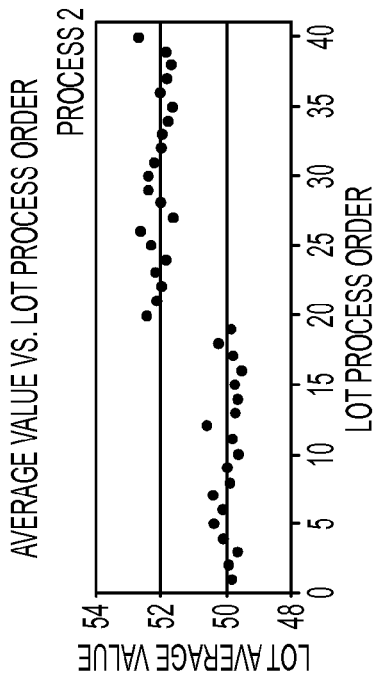
FIGS. 2-5 are graphical depictions of lot average values vs. a lot process order for various processes.
Figure 5:
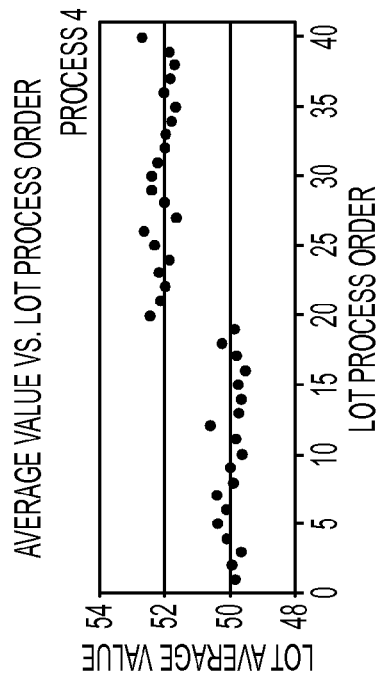
Figure 2:
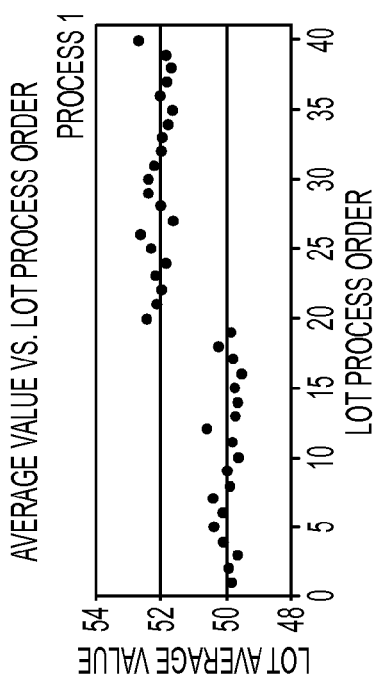
Figure 4:
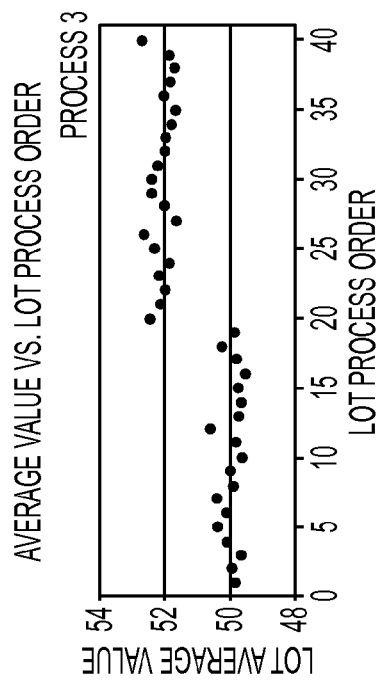
Figure 7:
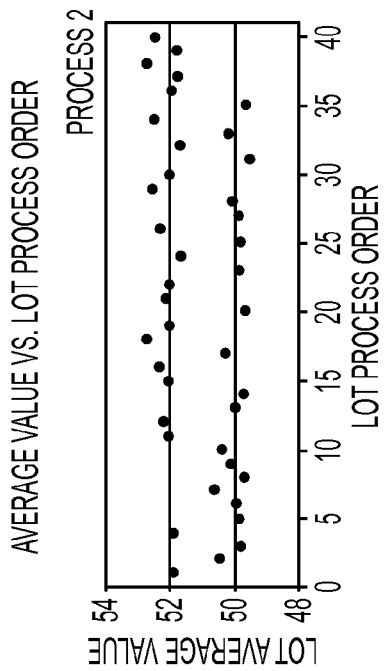
FIGS. 6-9 are graphical depictions of lot average values vs. a lot process order for various processes in accordance with embodiments of the present invention.
Figure 9:
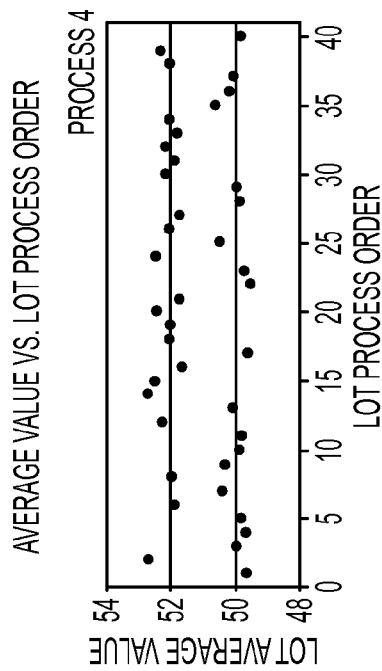
Figure 6:
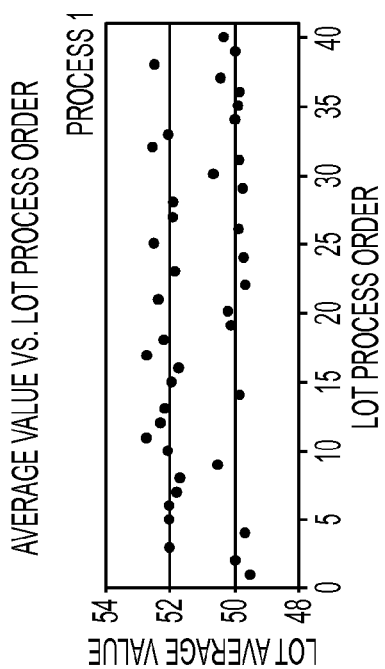
Figure 8:
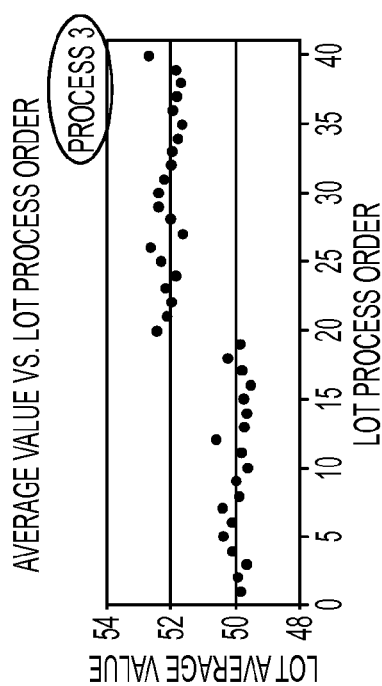

With reference to FIG. 1, a system 10 for lot based, multi-step wafer manufacturing processes is provided. The system 10 includes a transfer apparatus 20, a dispatcher 30, a processor 50 and a measurement unit 60. The transfer apparatus 20, such as a conveyer belt assembly 201 and/or a robotic arm 202, is disposed among a plurality of tools 21. The tools 21 each perform respective process steps on each wafer 25 of each lot 26 of wafers 25 that is transferred thereto. These process steps include but are not limited to plasma vapor or chemical vapor deposition (PVD or CVD), ion implantation, lithography, etching, stripping, cleaning, annealing, rapid thermal processing (RTP), furnace processing chemical mechanical planarization (CMP) and/or metrology.

In lot based, multi-step wafer manufacturing, a lot 26 may include anywhere from 10-50 or more individual wafers 25 that are each processed according to a predefined sequence of process steps. These process steps may include various process steps by which microscopic circuitry is formed on the wafers 25 and additional steps by which the wafers 25 are cleaned, measured and verified. A single production line may involve 100 s to 1000 s or more of lots 26 and 100 s to 1000 s of individual process steps. Normally, the lots 26 move from tool-to-tool in a given lot order that does not significantly change from the first process step to the last. The transfer apparatus 20 is configured to transfer each lot 26 from a current tool 21 to a next tool 21 in accordance with the process step sequence.

In conventional systems for executing lot based, multi-step wafer manufacturing processes, an effect from a single one of the process steps may degrade the systems' overall processing performance with a distinct temporal signature. For example, the performance may shift from one performance level to another due to a malfunction of the third tool 21 in the process step sequence. If the lot sequence is unchanged throughout the process step sequence, however, the time series of the performance vs. the lot sequence at each process step will look identical, as shown in FIGS. 2-5, in which lot average value is compared with lot process order positions and processes 1-4 all have similar curves. This similarity makes it impossible to use charts or time series analysis to distinguish between all the possible process steps as possible sources of the distinct temporal signature. On the other hand, an extent to which the lot sequence is not identical at each process step provides sensitivity to a time series analysis of the performance vs. lot sequence data on a process step basis.

Still referring to FIG. 1, detectors 27, such as optical and/or weight sensors, may optionally be provided at one or more of the tools 21 or the transfer apparatus 20. The detectors 27 serve to monitor lot queue lengths and/or other similar conditions at each of the tools 21. A lot queue occurs when multiple lots 26 await processing associated with a particular process step. In some cases, this manifests within the system 10 as a whole, the processes of the dispatcher 30 and/or physically with multiple lots 26 being delivered to a particular tool 21, which can only operate on each lot 26 separately and in sequence.

In general, if each process step performed by each tool 21 in the process step sequence required similar times to complete their corresponding process step, lot queue lengths would not increase significantly. However, where a process step and/or a particular tool 21 operates relatively slowly, the lot queue length at that process step/tool 21 may increase substantially. This is particularly true where the preceding process steps and tools 21 operate relatively quickly. The detectors 27 are configured to detect when this occurs and issue a signal(s) indicative of the lot queue lengths and/or other observed and detected tool conditions. As will be discussed below, where the dispatcher 30 knows, records or is otherwise aware of the whereabouts of each lot 26, lot 26 position determination is trivial and detection capability as provided by the detectors 27 may be unnecessary.

The dispatcher 30 or manufacturing executing system (MES) is operably coupled to the transfer apparatus 20 and is receptive of the signal(s) issued by the detectors 27. The dispatcher is thereby able to judge when a lot order modification condition detection exists. By way of the operable coupling between the dispatcher 30 and the transfer apparatus 20, the dispatcher 30 is further able to modify the lot order in response to the modification condition detection.

As an example, the modification condition detection may occur when the lot queue length at a particular tool 26 exceeds a predefined number of lots 26 although it is to be understood that this is merely exemplary and that other types of modification condition detections may be made. Such a modification condition detection may be made by the detector 27 detecting that the total combined weights of the lots 26 in the lot queue exceed a weight threshold or by observing that the total combined light reflected by the lots 26 in the queue is above a reflected light threshold. Alternatively, the modification condition detection may be made trivially by the dispatcher 30, which knows, records or is otherwise aware of the whereabouts of each lot 26.

In accordance with an embodiment of the invention, the dispatcher 30 may modify the lot order by randomizing the order of lots 26 within a lot queue of a given length (see, e.g., lot queue 302 in comparison with lot queue 301 in FIG. 1). By contrast, in accordance with an alternative embodiment, the dispatcher 30 may modify the lot order by reversing the order of the lots 26 within a lot queue of a given length (see, e.g., lot queue 303 in comparison with lot queue 302).

In accordance with further embodiments of the invention, the dispatcher 30 may force a lot queue of multiple lots 26 and then modify the lot order as described above. In this way, even if the sequence of process steps does not tend to form lot queues of significant length, the dispatcher 30 may cause such a lot queue in order to induce lot order modification that would make it possible to conduct time series analysis. As an example, a particular process step may be executable by tool 21 having multiple sub-tools 211 and 212 included therein, with sub tool 211 being slow to execute the process step and sub tool 212 being fast to execute the process step. In this case, the dispatcher 30 may either stop execution of the process step at the sub-tools 211 and 212 or instruct the transfer apparatus 20 to send lots 26 only to sub-tool 211. In doing so, a lot queue would be expected to form at sub-tool 212 after a predefined period of time. Eventually modification condition detection will occur and lot order modification can ensue.

The ability of the dispatcher 30 to force lot queue length may be particularly useful for those production fleets that are observed to not have significant queue lengths formed during their process step sequence. In such a case, it may be desirable to force a queue length such that lot order modification can be employed and the system 10 studied, as described below.

The system 10 further includes a measurement unit 60, which is configured to receive each wafer 25 of each fully processed lot 26, and to collect measurements from those wafers 25. The measurements may be any suitable wafer measurement or metrological step, such as total process time, quality control measurements, etc., and are transmittable to the processor 50. The processor 50 is disposed in signal communication with the dispatcher 30 and the measurement unit 60 and includes processing and memory/storage units. The memory/storage units have executable instructions stored thereon, which, when executed, cause the processing unit to analyze the measurements relative to the lot order at each tool 21 for evidence that a process step of a corresponding one of the tools 21 is responsible for performance effects of the system 10 as a whole. In some embodiments, at least the dispatcher 30 and the processor 50 are disposed within a single component or computing device. In accordance with alternative embodiments, the measurements and the analysis may each be completed automatically or manually.

With reference to FIGS. 6-9, it may be seen that, by modifying the order of the lots 26 at least time series analysis can be conducted by the processor 50 for evidence that a process step of a corresponding one of the tools 21 is responsible for performance effects of the system 10 as a whole. In contrast to the similar curves of FIGS. 2-5, as shown in FIGS. 6-9, lot order modification before each of processes 1-4 results in disorganized data for processes 1, 2 and 4 but in organized data for process 3. This indicates that it is process 3, which may be the source of performance effects for the process step sequence.

In accordance with aspects of the invention, the dispatcher 30 may also modify the lot order in response to a lot order constraint. A lot order constraint is a general instruction to modify the lot order or to maintain the lot order and may include, for example, a priority indication that sets forth that a certain lot 26 or multiple lots 26 is/are to be given priority for a process step at a tool 21 or an instruction to perform selective randomizations. Such a constraint modifies the lot order but, since the constraint tends not to modify the lot order significantly, additional lot order modification, as described above, is necessary to facilitate analysis by the processor 50.

Since the dispatcher 30 or MES knows, records or is otherwise aware of the whereabouts of all of the lots 26, it is to be understood that the queues discussed above are not necessarily physical queues of multiple lots 26 at particular tools 21. As such, the length of a queue can be determined at any time regardless of where the lots 26 are physically located provided they have completed the previous process. In addition, the lots 26 may often be stored between process steps in a "stocker" system, which is not physically located at any of the tools 21. Thus, since determining the length of a lot queue is a trivial matter for the dispatcher 30, detecting the length of a queue is not necessary.

Figure 10:
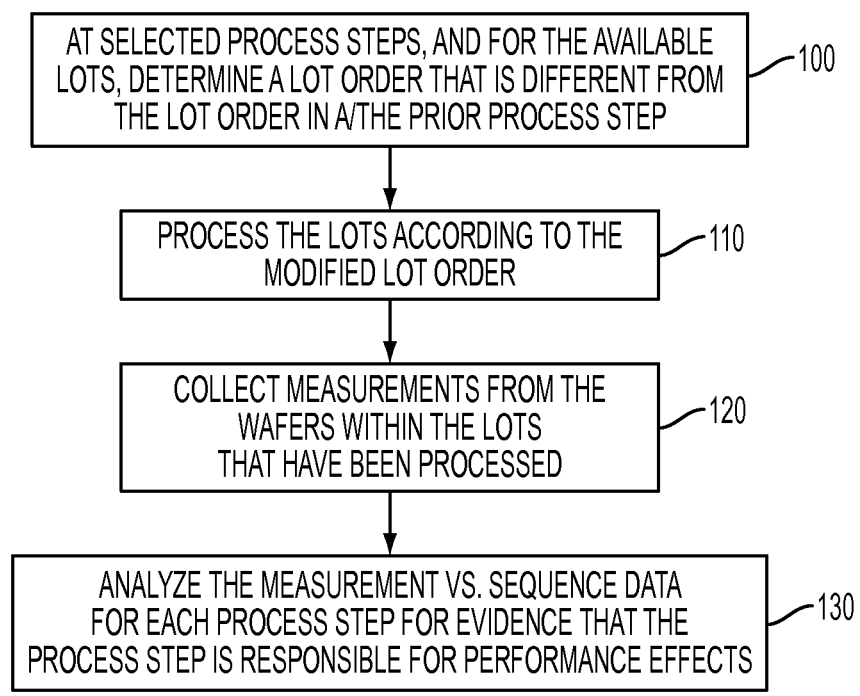
FIG. 10 is a flow diagram illustration a method of lot order modification for use by the system of FIG. 1.

In accordance with further aspects of the invention and, with reference to FIG. 10, a method of operating the system 10 for lot based, multi-step wafer manufacturing processes is provided. As shown in FIG. 18, the method includes determining via randomization, reversal, forced queuing and subsequent modification or some other similar method a modified lot order that is different from a lot order in a prior process step at selected process steps and for available lots 26 as determined by lot order constraints (100), processing the lots 26 according to the modified lot order at the selected process steps (110), collecting measurements from wafers 25 within the lots 26 that have been fully processed (120) and analyzing the measurements relative to lot order sequence data for each process step for evidence that a process step is responsible for performance effects (130).

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A system for lot based, multi-step wafer manufacturing processes, the system comprising:
   a transfer apparatus, disposed among tools for performing respective process steps on each wafer of each lot of wafers transferred thereto, the transfer apparatus being configured to transfer each lot from a current tool to a next tool in accordance with a process step sequence;
   a plurality of detectors disposed at each of the tools to monitor current conditions and to issue signals indicative of the monitoring;
   a dispatcher operably coupled to the transfer apparatus to modify the lot order at a tool in response to a modification condition detection at the tool, the modification condition being recognized by the dispatcher in accordance with the signals issued by the detectors;
   a measurement unit configured to receive each wafer of each fully processed lot and to collect measurements therefrom; and
   a processor disposed in signal communication with the dispatcher and the measurement unit to analyze the measurements relative to the modified lot order for evidence that a process step associated with the tool at which the modification of the lot order was executed is responsible for performance effects;
   wherein the dispatcher forces a lot queue of multiple lots and then modifies the lot order, wherein the dispatcher forces the lot queue of multiple lots by:
      stopping an execution of a process step at a corresponding tool; and
      in a case in which a tool comprises a fast executing sub-tool and a slow executing sub-tool, sending lots to only the slow executing sub-tool having a substantial increase in lot queue length.

2. The system according to claim 1, wherein the tools comprise tools for executing plasma vapor or chemical vapor deposition (PVD or CVD), ion implantation, lithography, etching, stripping, cleaning, annealing, rapid thermal processing (RTP), furnace processing chemical mechanical planarization (CMP) and/or metrology.

3. The system according to claim 1, wherein the modification condition is a queue length of multiple lots such that a lot queue length exceeds a predefined number of lots.

4. The system according to claim 1, wherein the dispatcher modifies the lot order by randomization of an order of lots within a lot queue of a given length.

5. The system according to claim 1, wherein the dispatcher modifies the lot order by reversal of an order of the lots within a lot queue of a given length.

6. A system for lot based, multi-step wafer manufacturing processes, the system comprising:
   a transfer apparatus, disposed among tools for performing respective process steps on each wafer of each lot of wafers transferred thereto, the transfer apparatus being configured to transfer each lot from a current tool to a next tool in accordance with a process step sequence;
   a plurality of detectors disposed at each of the tools to monitor current conditions and to issue signals indicative of the monitoring;
   a dispatcher operably coupled to the transfer apparatus to modify the lot order in response to a lot order constraint and to modify the lot order at a tool in response to a modification condition detection at the tool, the modification condition being recognized by the dispatcher in accordance with the signals issued by the detectors;
   a measurement unit configured to receive each wafer of each fully processed lot and to collect measurements therefrom; and
   a processor disposed in signal communication with the dispatcher and the measurement unit to analyze the measurements relative to the modified lot order for evidence that a process step associated with the tool at which the modification of the lot order was executed is responsible for performance effects;
   wherein the dispatcher forces a lot queue of multiple lots and then modifies the lot order, wherein the dispatcher forces the lot queue of multiple lots by:
      stopping an execution of a process step at a corresponding tool; and
      in a case in which a tool comprises a fast executing sub-tool and a slow executing sub-tool, sending lots to only the slow executing sub-tool having a substantial increase in lot queue length.

7. The system according to claim 6, wherein the lot order constraint comprises a priority indication.

8. The system according to claim 6, wherein the tools comprise tools for executing plasma vapor or chemical vapor deposition (PVD or CVD), ion implantation, lithography, etching, stripping, cleaning, annealing, rapid thermal processing (RTP), furnace processing chemical mechanical planarization (CMP) and/or metrology.

9. The system according to claim 6, wherein the modification condition is a queue length of multiple lots such that a lot queue length exceeds a predefined number of lots.

10. The system according to claim 6, wherein the dispatcher modifies the lot order by randomization of an order of lots within a lot queue of a given length.

11. The system according to claim 6, wherein the dispatcher modifies the lot order by reversal of an order of the lots within a lot queue of a given length.

12. A method of operating a system for lot based, multi-step wafer manufacturing processes, the method comprising:
monitoring current conditions by detectors at tools for performing the process steps and issuing signals indicative of the monitoring;
at selected process steps and for available lots, determining at the corresponding tools a modified lot order that is different from a lot order in a prior process step in response to a modification condition detection recognized by a dispatcher in accordance with the issued modifying the lot order at each of the selected process steps by the dispatcher in accordance with the modified lot order;
processing the lots according to the modified lot order;
collecting measurements from wafers within the lots that have been fully processed; and
analyzing the measurements relative to lot order sequence data for evidence that one process step from among the selected process steps at which each of the lot order modifications occurred is responsible for performance effects and that the other process steps are not responsible for the performance effects,
wherein the analyzing comprises identifying as the evidence organized data associated with the one of the process steps and disorganized data associated with the other process steps;
wherein the determining comprises forcing a lot queue of multiple lots and then modifying the lot order, wherein the forcing is accomplished by the dispatcher and comprises:
stopping an execution of a process step at a corresponding tool; and
in a case in which a tool comprises a fast executing sub-tool and a slow executing sub-tool, sending lots to only the slow executing sub-tool having a substantial increase in lot queue length.

13. The method according to claim 12, wherein the available lots are identified in accordance with a lot order constraint.

14. The method according to claim 12, wherein the determining comprises randomizing the lot order of an order of lots within a lot queue of a given length.

15. The method according to claim 12, wherein the determining comprises reversing the lot order within a lot queue of a given length.

* * * * *